(12) United States Patent
Zhu et al.

(10) Patent No.: US 12,418,157 B2
(45) Date of Patent: Sep. 16, 2025

(54) VCSEL EQUALIZATION TECHNIQUES FOR HIGH SPEED OPTICAL TRANSMISSION

(71) Applicant: HEWLETT PACKARD ENTERPRISE DEVELOPMENT LP, Houston, TX (US)

(72) Inventors: Zhubiao Zhu, Ft. Collins, CO (US); Daniel Alan Berkram, Ft. Collins, CO (US); Ronaldo Sanchez, Ft. Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 963 days.

(21) Appl. No.: 17/460,185

(22) Filed: Aug. 28, 2021

(65) Prior Publication Data

US 2023/0067582 A1    Mar. 2, 2023

(51) Int. Cl.
*H01S 5/062*    (2006.01)
*H01S 5/0239*   (2021.01)
*H01S 5/042*    (2006.01)
*H01S 5/183*    (2006.01)

(52) U.S. Cl.
CPC ...... *H01S 5/06226* (2013.01); *H01S 5/06216* (2013.01); *H01S 5/0239* (2021.01); *H01S 5/0428* (2013.01); *H01S 5/183* (2013.01)

(58) Field of Classification Search
CPC ................................................ H01S 5/06226
See application file for complete search history.

(56) References Cited

U.S. PATENT DOCUMENTS

| | | | |
|---|---|---|---|
| 5,602,672 A * | 2/1997 | Ishimura | G02F 1/0121 359/245 |
| 2004/0160996 A1* | 8/2004 | Giorgi | H01S 5/042 372/25 |
| 2005/0025202 A1* | 2/2005 | Kagaya | H01S 5/0427 372/38.02 |
| 2005/0111503 A1* | 5/2005 | Ishigami | H01S 5/02345 372/38.1 |
| 2013/0094802 A1* | 4/2013 | Azadeh | H01S 5/042 29/428 |
| 2017/0250520 A1* | 8/2017 | Zhou | H01S 5/183 |
| 2021/0336413 A1* | 10/2021 | Kobayashi | H01S 5/0427 |

* cited by examiner

*Primary Examiner* — Sean P Hagan
(74) *Attorney, Agent, or Firm* — Sheppard Mullin Richter & Hampton LLP

(57) ABSTRACT

An optical emitter includes a vertical cavity surface emitting laser (VCSEL), an equalization circuit coupled to the VCSEL; and a current source coupled to the VCSEL and the equalization circuit. The equalization circuit is configured to divert a first current from the current source to the VCSEL at a first data frequency and divert a second current greater than the first current from the current source to the VCSEL at a second data frequency higher than the first data frequency.

8 Claims, 6 Drawing Sheets

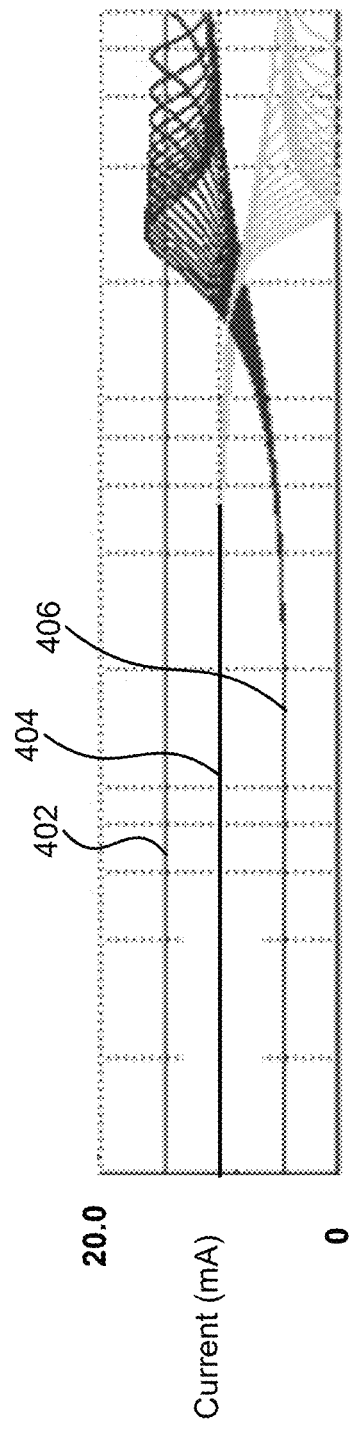
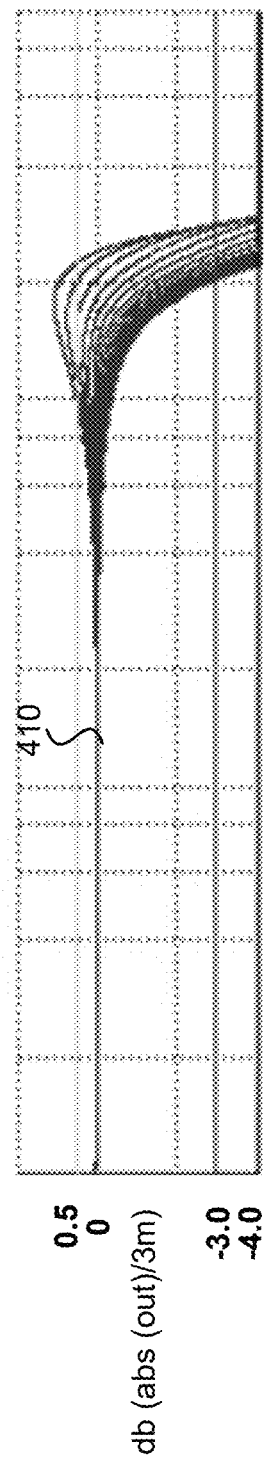
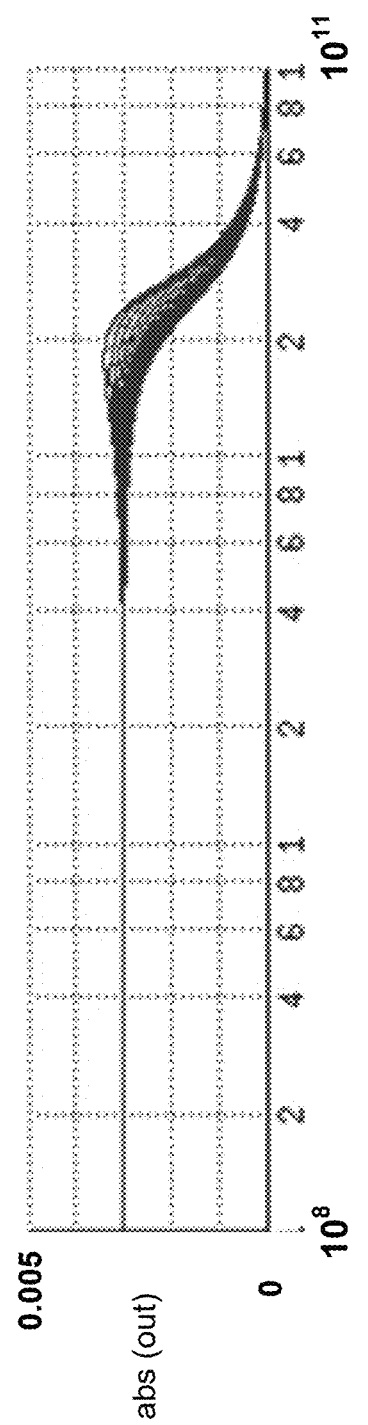
FIG. 4A
FIG. 4B
FIG. 4C

VCSEL EQUALIZATION TECHNIQUES FOR HIGH SPEED OPTICAL TRANSMISSION

DESCRIPTION OF RELATED ART

Machine Learning and Artificial Intelligence applications are having a major influence on network connectivity requirements in the datacenter. Rather than a typical hierarchy where the lowest-level servers require limited network bandwidth—increasing only as you move up through levels of switches—these new applications require much higher network performance and additional connectivity at all levels of the hierarchy. From a hardware perspective, these changes mean there is a need for cost effective optical links to interconnect servers and switches at high bandwidth and low latency.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 4A shows current values including a total current, currents to a VCSEL-side equalization circuit, and currents going to the VCSEL for a VCSEL with an equalization circuit, according to one example embodiment.

FIG. 4B shows the optical outputs from the VCSEL of FIG. 4A in unit of db(abs(out))/3 m.

FIG. 4C shows optical outputs from the VCSEL of FIG. 4A in unit of mA.

Figure 1:
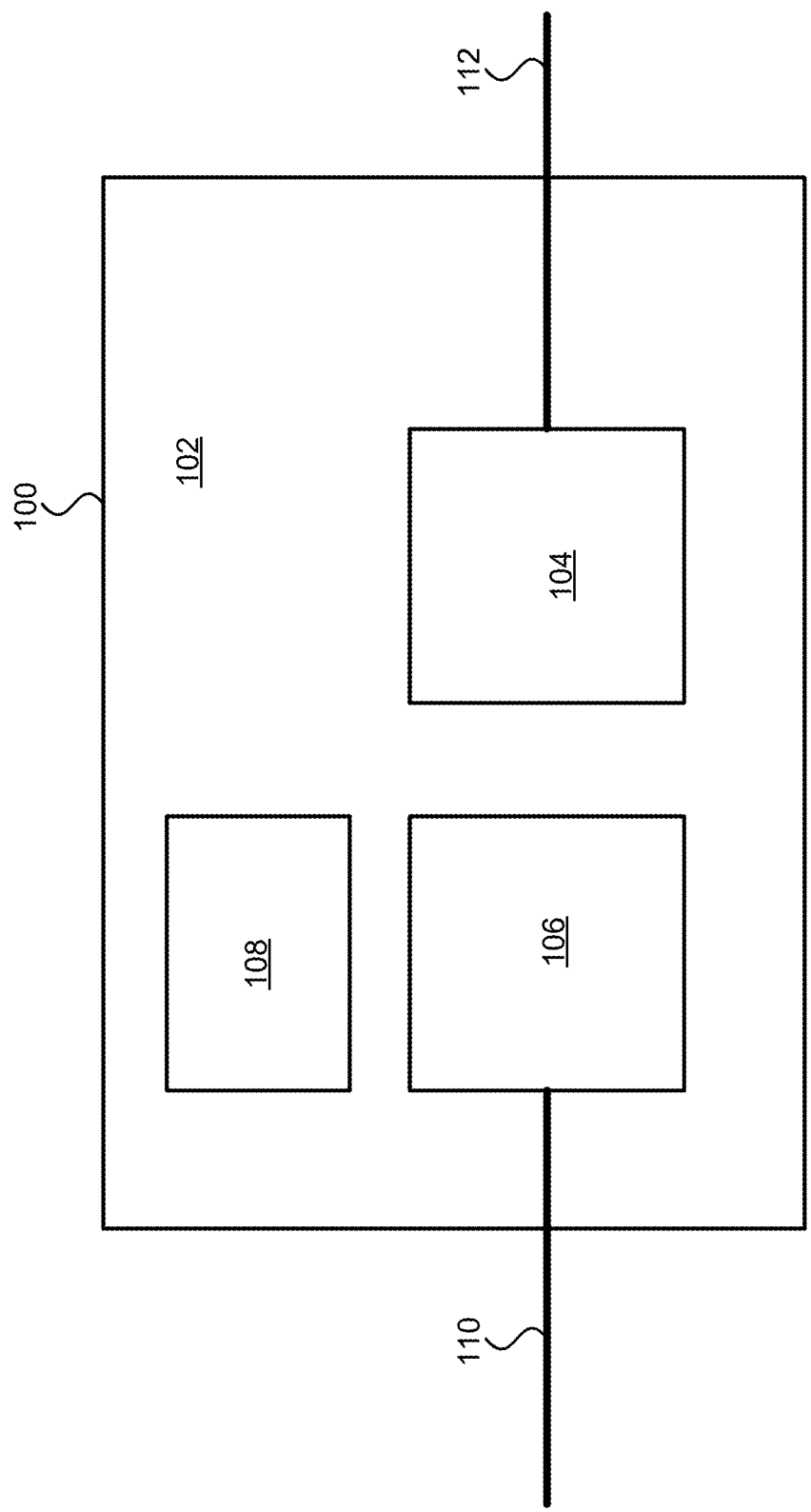
FIG. 1 is a block diagram of an optical emitter according to one example embodiment.

The figures are not exhaustive and do not limit the present disclosure to the precise form disclosed.

DETAILED DESCRIPTION

Cost-effective optical solutions using four wavelengths of Vertical Cavity Surface Emitting Lasers (VCSELs) tightly integrated into a module with a complementary metal-oxide-semiconductor (CMOS) driver/receiver integrated circuit (IC) are desirable. Those solutions generally use multi-level modulation such as Pulse Amplitude Modulation 4-level (PAM4). The solutions have attracted significant interest with their significant improvement over the prior solutions. It is expected that switch port bandwidth may increase from 200 Gbps (e.g., 4 lanes each at 50 Gbps) to 400 Gbps (e.g., 4 lanes each at 100 Gbps) when the difficulty of trying to connect endpoints together at any distance electrically becomes a significant challenge. Since the transition to these higher bandwidths is also predicted to occur faster than previous predictions, it is desirable to find solutions that may double the bandwidth while keeping all the advantages currently enjoyed in the 200G generation, such as high-bandwidth in a small form factor, low-cost, electrical compatibility with multiple standards, and the ability to integrate multiple instances directly into a switch application-specific integrated circuit (ASIC).

One key problem is the VCSEL bandwidth and the high impedance of the VCSEL. Doubling of the speed usually requires doubling the VCSEL bandwidth. But VCSEL bandwidth is hard to be increased, due to physical constraints. Unlike those in optical cable applications, high speed servers have a longer transmission line between the driving chip and VCSEL, so reflections are a big issue. A matched transmission line impedance is needed.

Techniques disclosed herein provide next-generation VCSEL-based optical emitter for optical links. The disclosed VCSEL equalization techniques can be applied to high speed optical transmission to at least double the existing bandwidth (e.g., from 200 Gbps to 400 Gbps). The high bandwidth solutions can be employed to bring optical serializer/deserializer (SerDes) technologies to a bandwidth larger than 100 Gbps. These Optical SerDes can be integrated into high performance ASICs such as switches or in standalone modules (e.g., electrical-to-optical transceivers). Because this optical technology is designed for both low-cost and high-bandwidth, it provides system architectures and system topologies that were not previously viable due to the cost of industry optical solutions. Also, since it is optical, it breaks system designs free from the increasingly constrained distances of electrical connections. The disclosed VCSEL equalization can increase the bandwidth of VCSEL and make the VCSEL-side impedance matching and also makes it easy to adapt VCSEL change.

Various embodiments describe optical emitters for optical transmissions. In some embodiments, an optical emitter may include a VCSEL and an equalization circuit coupled to the VCSEL. The equalization circuit is configured to divert a higher current from a current source to the VCSEL at a higher data frequency. The equalization circuit may be disposed on an interposer such that it is separable from the VCSEL. This design bring flexibility in case a new VCSEL is employed for the emitter. Being part of an interposer, the equalization circuit allows flexibility in matching due to the quick design change ability the interposer offers compared to regular integrated chips. For example, when the new VCSEL impedance is increased, the equalization circuit can be quickly redesigned to match the VCSEL-side impedance value with the impedance of a transmission line and impedance of the VCSEL driver. The solution reduces time and cost to develop new VCSEL emitters.

FIG. 1 is a block diagram of an optical emitter 100 according to one example embodiment. The optical emitter 100 includes an interposer 102, one or more VCSELs 104 (a singular form of VCSEL 104 is used hereinafter), an equalization circuit 106, a periphery circuit 108, a transmission line 110, and an optical cable 112. The interposer 102 may be a printed circuit board or other boards/substrates that can support circuitry for the optical emitter 100. The VCSEL 104 may be a semiconductor chip that can be mounted on the interposer 102. As such, the VCSEL 104 may be separable from the interpose 102. The equalization circuit 106 is also disposed on the interposer 102 and may include a plurality of electronic components as will be described in more detail in FIGS. 3A-3C that may be individually mounted on the interposer 102. The periphery circuit 108 is disposed on the interposer 102 and may include other necessary to drive the VCSEL 104 or control the operations of the optical emitter 100. The VCSEL 104, the equalization circuit 106 and the periphery circuit 108 are electrically coupled to each other to form the optical emitter 100.

The transmission line 110 is configured to connect the optical emitter 100 to other electronic component of a system (not shown). For example, the optical emitter 100 may be applied to a cable system, a server system, a data center, a computer system, whereas the transmission line 110 may connect the optical emitter 100 to a server, a controller, a laptop, a desktop, a mobile device, or other electronic devices. The optical cable 112 is configured to transmit optical signals from the VCSEL 104 to a destination (not shown).

The equalization circuit 106 is configured to divert a first current from a current source to the VCSEL 104 at a first data frequency and divert a second current greater than the first current from the current source to the VCSEL 104 at a second data frequency higher than the first data frequency. When more current is diverted to the VCSEL 104 at higher frequencies (e.g., more than 10 GHz), the VCSEL 104 can provide more bandwidth to transmit data.

It should be understood that the configuration of the optical emitter 100 is provided solely as an example. Other configurations are contemplated.

Figure 2:
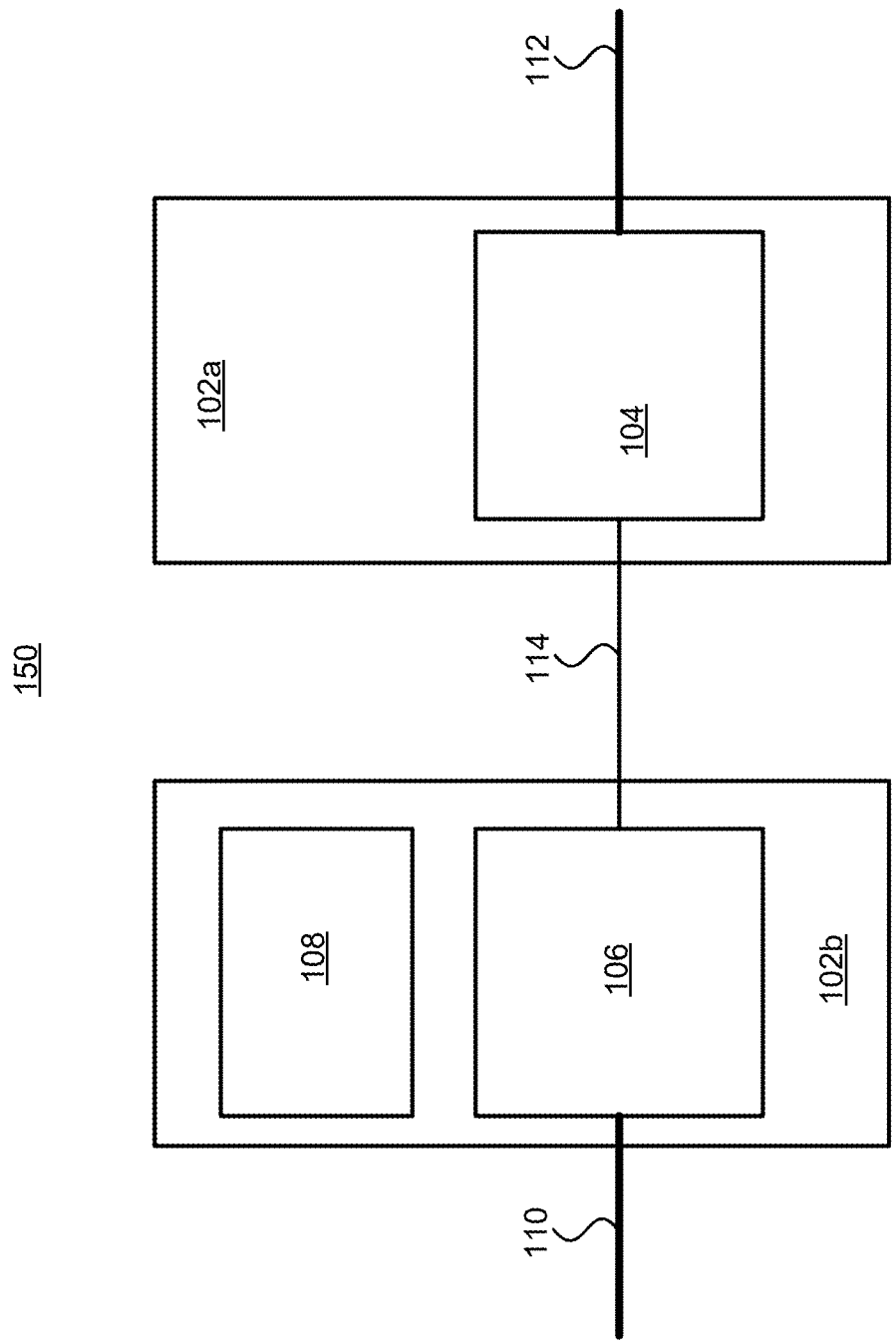
FIG. 2 is a block diagram of another optical emitter according to one example embodiment.

FIG. 2 is a block diagram of another optical emitter 150 according to one example embodiment. The optical emitter 150 includes a first interposer 102a, a second interposer 102b, one or more VCSELs 104 (a singular form of VCSEL 104 is used hereinafter), an equalization circuit 106, a periphery circuit 108, a transmission line 110, and an optical cable 112. The interposers 102a and 102b may be a printed circuit board or other boards/substrates that can support circuitry for the optical emitter 100. The VCSEL 104 is disposed on the first interposer 102a, while the equalization circuit 106 and the periphery circuit 108 are disposed on the second interposer 102b. The VCSEL 104, the equalization circuit 106, the periphery circuit 108, the transmission line 110, and the optical cable 112 of the optical emitter 150 are similar to those of the optical emitter 100 of FIG. 1. Their functions and configurations may be referred to above as described with respect to FIG. 1. The first interposer 102a and the second interposer 102b are connected to each other with a link 114.

It should be understood that the configuration of the optical emitter 150 is provided solely as an example. Other configurations are contemplated. For example, the periphery circuit 108 may be disposed on the first interposer 102a.

Figure 3A:
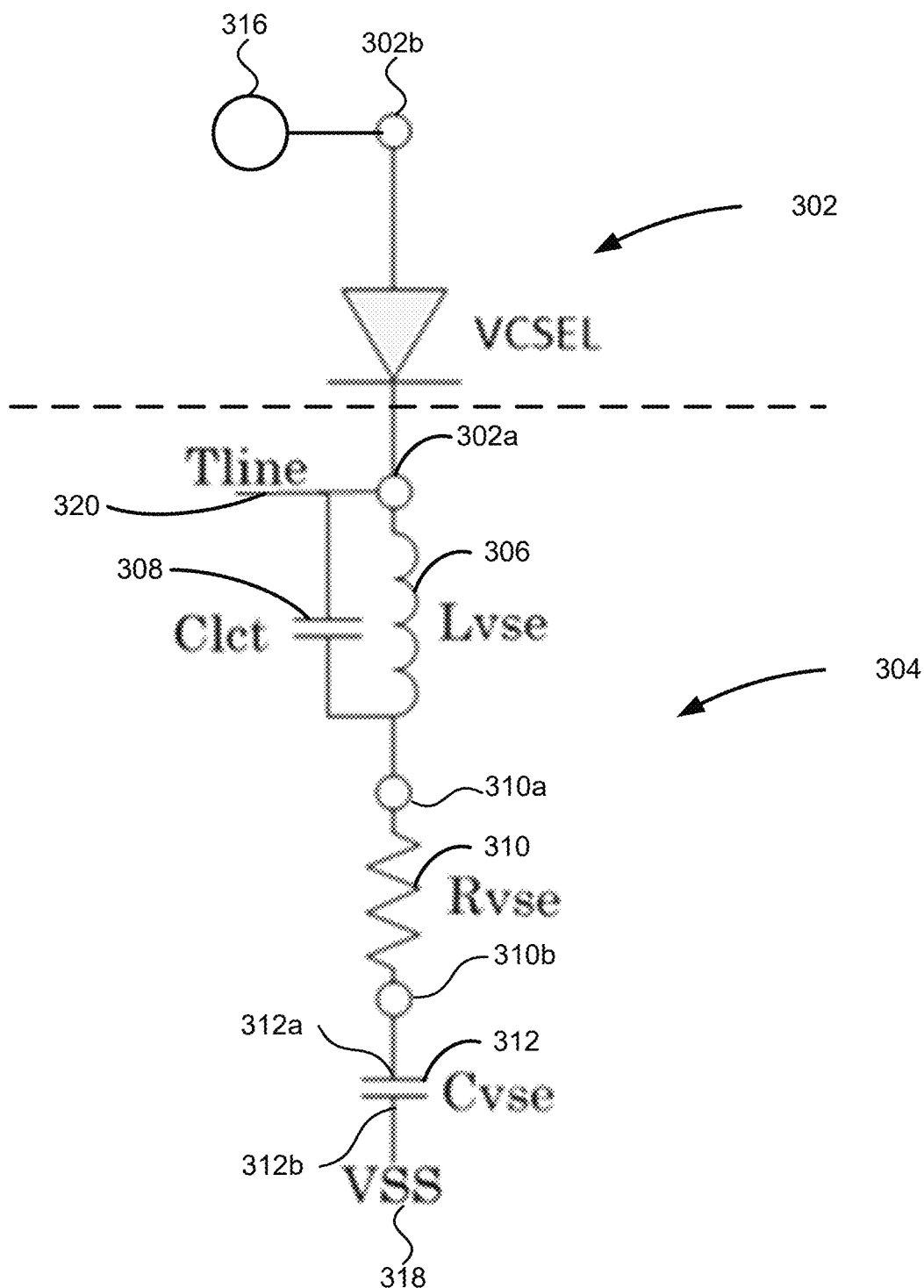
FIG. 3A is a circuit diagram of an optical emitter according to one example embodiment.

FIG. 3A is a circuit diagram of an optical emitter 300-1 according to one example embodiment. The optical emitter 300-1 includes a VCSEL 302 and an equalization circuit 304. The equalization circuit 304 includes an inductor (Lvse) 306, a first capacitor (Clct) 308, a resistor (Rvse) 310, and a second capacitor (Cvse) 312. The inductor 306 is coupled between a first terminal 302a of the VCSEL 302 and a first terminal 310a of the resistor 310. The first capacitor 308 is coupled in parallel with the inductor 306 and between the first terminal 302a of the VCSEL 302 and the first terminal 310a of the resistor 310. The resistor 310 has a second terminal 310b coupled in series with a first terminal 312a of the second capacitor 312.

The VCSEL 302 has a second terminal 302b opposite to the first terminal 302a of the VCSEL 302. The second terminal 302b of the VCSEL 302 is coupled to the current source 316. The second capacitor 312 has a second terminal 312b opposite to the first terminal 312a of the second capacitor 312. The second terminal 312b of the second capacitor 312 is coupled to a reference voltage VSS 318 (e.g., ground). The first terminal 302a of the VCSEL 302 is coupled to a transmission line (Tline) 320.

The equalization circuit 304 is configured to divert a first current from the current source 316 to the VCSEL 302 at a first data frequency and divert a second current greater than the first current from the current source 316 to the VCSEL 302 at a second data frequency higher than the first data frequency. This allows the VCSEL 302 to provide greater bandwidth (e.g., about or more than 20 Gbps) to transmit data.

In some embodiments, the equalization circuit 304 also provides design flexibility to reduce electrical reflection. Reflection may occur when there is a different between the resistance of the transmission line 320 and the resistance of the VCSEL 302. To reduce the reflection, the resistance of the transmission line 318 and the resistance of the VCSEL 302 would need to be similar. The resistance of the VCSEL 302 is determined by the physical limitations of the manufacturing processes and materials used to make the VCSEL 302. For example, the VCSEL 302 may be produced by a 16 nm CMOS technology or a 7 nm CMOS technology. These technologies determine the sizes, materials and form factors of the VCSEL 302 and contribute to its eventual impedance. Generally, because of the current CMOS technologies, the VCSEL 302 has a resistance of about 150-200 ohm.

On the other hand, the impedance of the transmission line 318 is determined by the applications that uses the VCSEL 302. For example, a cable application generally requires a resistance of in the scale of 50 ohm. Because the difference between the resistances of the VCSEL 302 and the transmission line 318, the electrical reflection is inevitable that reduces the efficiency of the optical emitter 300-1. The equalization circuit 304 is configured to match the resistance of the VCSEL side (the VCSEL 302+equalization circuit 304) with the resistance of the transmission line 318. This can be achieved by an optimized selection of values for the components (e.g., the inductor 306, the first capacitor 308, the resistor 310, and the second capacitor 312).

Figure 3B:
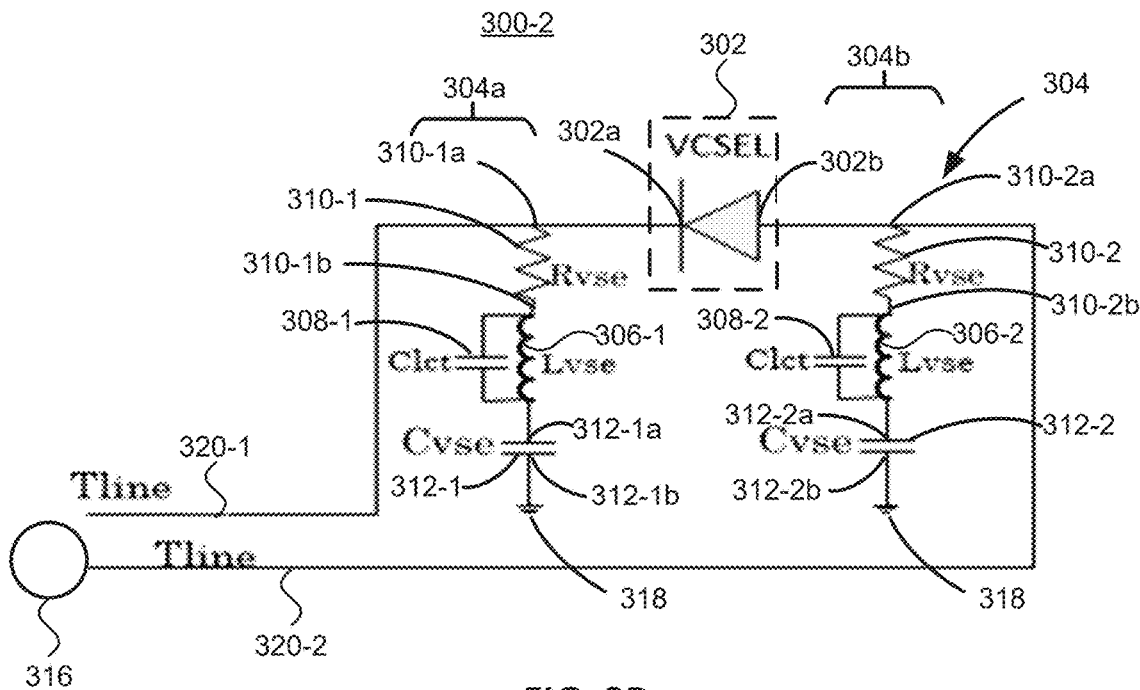
FIG. 3B is a circuit diagram of another optical emitter according to one example embodiment.

FIG. 3B is a circuit diagram of another optical emitter 300-2 according to one example embodiment. The optical emitter 300-2 includes a VCSEL 302 and an equalization circuit 304. The VCSEL 302 has a first terminal 302a and a second terminal 302b. The equalization circuit 304 includes a first portion 304a coupled to the first terminal 302a of the VCSEL 302 and a second portion 304b coupled to the second terminal 302b of the VCSEL 302. The first portion 304a of the equalization circuit 304 includes an inductor (Lvse) 306-1, a first capacitor (Clct) 308-1, a resistor (Rvse) 310-1, and a second capacitor (Cvse) 312-1. The resistor 310-1 has a first terminal 310-1a coupled to a first transmission line (Tline) 320-1. The inductor 306-1 is coupled between a second terminal 310-1b of the resistor 310-1 and a first terminal 312-1a of the second capacitor 312-1. The first capacitor 308-1 is coupled in parallel with the inductor 306-1 and between the second terminal 310-1b of the resistor 310-1 and the first terminal 312-1a of the second capacitor 312-1. The second capacitor 312-1 has a second terminal 312-1b coupled to ground 318.

The second portion 304b of the equalization circuit 304 includes an inductor (Lvse) 306-2, a first capacitor (Clct) 308-2, a resistor (Rvse) 310-2, and a second capacitor (Cvse) 312-2. The resistor 310-2 has a first terminal 310-2a coupled to a second transmission line (Tline) 320-2 that is coupled to a current source 316. Other connections of the components of the second portion 304b are similar to those of the first portion 304a, and will be omitted for brevity.

The equalization circuit 304 is configured to divert a first current from the current source 316 to the VCSEL 302 at a first data frequency and divert a second current greater than the first current from the current source 316 to the VCSEL 302 at a second data frequency higher than the first data frequency. This allows the VCSEL 302 to provide greater bandwidth (e.g., about or more than 20 Gbps) to transmit data.

Figure 3C:
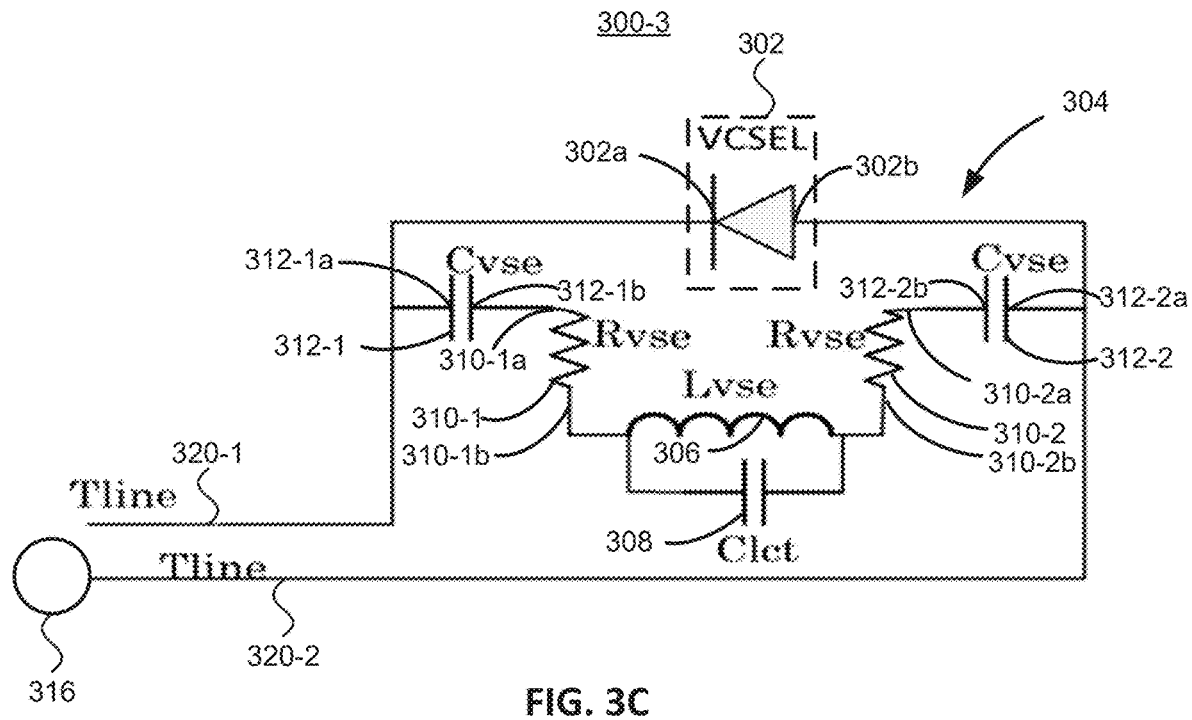
FIG. 3C is a circuit diagram of yet another optical emitter according to one example embodiment.

FIG. 3C is a circuit diagram of another optical emitter 300-3 according to one example embodiment. The optical emitter 300-3 includes a VCSEL 302 and an equalization circuit 304 coupled to the VCSEL 302 in parallel. The VCSEL 302 has a first terminal 302a coupled to a first transmission line (Tline) 320-1 and a second terminal 302b coupled to a second transmission line (Tline) 320-2. The second transmission line (Tline) 320-2 is further coupled to a current source 316. The equalization circuit 304 includes an inductor (Lvse) 306, a first capacitor (Clct) 308-1, a pair of resistors (Rvse) 310-1 and 310-2, and a pair of second capacitors (Cvse) 312-1 and 312-2. The second capacitor 312-1 has a first terminal 312-1a coupled to the first transmission line 320-1 and a second terminal 312-1b coupled to a first terminal 310-1a of the resistor 310-1. The second capacitor 312-2 has a first terminal 312-2a coupled to the second transmission line 320-2 and a second terminal 312-2b coupled to a first terminal 310-2a of the resistor 310-2.

The inductor 306 is coupled between a second terminal 310-1b of the resistor 310-1 and a second terminal 310-2b of the resistor 310-2. The first capacitor 308 is coupled in parallel with the inductor 306 and between the second terminal 310-1b of the resistor 310-1 and the second terminal 310-2b of the resistor 310-2.

The equalization circuit 304 is configured to divert a first current from the current source 316 to the VCSEL 302 at a first data frequency and divert a second current greater than the first current from the current source 316 to the VCSEL 302 at a second data frequency higher than the first data frequency. This allows the VCSEL 302 to provide greater bandwidth (e.g., about or more than 20 Gbps) to transmit data.

FIGS. 4A-4C shows the AC simulation results for the VCSEL 302 combined with the VCSEL-side equalization circuit 304. In the simulation, a value of the inductor 306 (Lvse) in FIG. 3A of the VCSEL-side equalization circuit 304 is swept from 0 to 0.35 nH with a step size of 0.025 nH while a value of the first capacitor 308 (Clct) is kept at 75 fF. FIG. 4A shows current values for the total current 402, the currents 404 to the VCSEL-side equalization circuit 304, and the currents 406 going to the VCSEL 302. As shown in FIG. 4A, at high frequencies more current is diverted to the VCSEL 302 and less current is diverted to VCSEL-side equalization circuit 304, which is a result of the frequencies approaching the resonant frequency of LC tank (inductor 306+first capacitor 308), which raises the impedance of the VCSEL-side equalization circuit 304 at higher frequencies. The current into the VCSEL 302 peaks at the LC tank's resonant frequency. After the peaking, the current going to the VCSEL decreases.

FIG. 4B shows the optical outputs 410 from the VCSEL 302 in unit of db(abs(out))/3 m. The 3 m is the optical light output at low frequency (such as at 0.1 GHZ in the FIG. 4B). As such at low frequency, the value is 0 db. The effective bandwidth of the VCSEL 302 is shown at the intersections of optical outputs 410 and the line 312 representing −3 db. As shown in FIG. 4B, the bandwidth of the VCSEL 302 increases as the value of the inductor 306 (Lvse) increases. At higher Lvse values, the bandwidth curve can have a positive peak near the target operation frequency. This overshoot would degrade the performance of the VCSEL 302. In some embodiments, a constraint may be added to keep the peak of the optical output below 0.5 dB to avoid ringing to the system. In the illustrated embodiment, the value of the inductor 306 (Lvse) close to 0.35 nH should be avoid to provide better performance for the the VCSEL 302. FIG. 4C shows optical outputs of the VCSEL 302 in unit of mA.

The results in FIG. 4A-4C confirm that the VCSEL-side equalization circuit 304 is effective in diverting more current to the VCSEL 302 at high frequencies (e.g., more than 10 GHZ, 15 GHZ, or 20 GHz, etc.). To avoid the ringing effect and provide better optical output at high frequencies, the values of the components ((e.g., the inductor 306, the first capacitor 308, the resistor 310, and the second capacitor 312) for the VCSEL-side equalization circuit 304 can be carefully selected to obtain an optimized performance. Table 1 below provides two example designs for an effective VCSEL-side equalization circuit (VSEC) 304 that brings improved bandwidth to VCSEL 302. As shown in the middle column of Table 1, a 161 ohm VCSEL is parried with a VCSEL-side equalization circuit to produce 50 ohm design. The results indicates that the 161 ohm VCSEL without the VCSEL-side equalization circuit has an operation frequency (bandwidth) of 10.54 GHZ, while the 161 ohm VCSEL with the VCSEL-side equalization circuit has an operation frequency (bandwidth) of 28 GHz, which presents a 2.7-time bandwidth enhancement. The right column shows data for a 161 ohm VCSEL parried with a VCSEL-side equalization circuit to produce 32 ohm design. The results indicates that the 161 ohm VCSEL without the VCSEL-side equalization circuit has an operation frequency (bandwidth) of 10.54 GHZ, while the 161 ohm VCSEL with the VCSEL-side equalization circuit has an operation frequency (bandwidth) of 30.2 GHZ, which presents a 2.9-time bandwidth enhancement.

TABLE 1

| VCSEL Model | V7b—161 ohm VCSEL 50 ohm design | V7b—161 ohm VCSEL 32 ohm Design |
| --- | --- | --- |
| Rvcsel (ohm) | 161 | 161 |
| Rvse (ohm) | 72.5 | 40 |
| R(total) (ohm) | 50 | 32.03 |
| Lvse (nH) | 0.3nH | 0.14nH |
| Clct (fF) | 100f | 125f |
| optical out (mW) | 3 | 3 |
| I(vcsel) (mA) | 4.44 | 4.46 |
| I(vse) (mA) | 10.05 | 18.15 |
| I(total) (mA) | 14.5 | 22.6 |
| Ibias (mA) | 7.5 | 7.5 |
| BW(GHz) with no VSEC | 10.54 | 10.54 |
| BW (GHz) with VSEC | 28 | 30.2 |
|  | 2.7X BW enhancement | 2.9X BW enhancement |

As shown in Table 1, the inductance (Lvse) and the capacitance (Clct) of the LC tank, and the resistance (Rvse) of the resistor of the equalization circuit can be selected to produce resulting resistance of the VCSEL side (the VCSEL+the equalization circuit) that matches the resistance of the transmission line. In the illustrated embodiments in Table 1, when the resistance of the VCSEL is greater than that of the transmission line, the resistance of the resistor is selected such that it is less than the resistance of the resistance of the VCSEL but greater than the resistance of the transmission line. It should be understood that these conditions are provided as mere examples, and not to limit the scope of this disclosure. Other optimized values for the components of the equalization circuit may be selected depending on the property of the VCSEL and the applications that employ the VCSEL. The techniques discloses herein inform one of ordinary skill in the art to select optimized values for the components of the equalization circuit such that the impedance of the VCSEL side (the VCSEL+the equalization circuit) can match the impedance of the transmission line to reduce electrical reflection.

As explained above, the current VCSEL devices generally have high impedance (e.g., about 160 ohms) due to physical constrains of the manufacturing processes and materials. High impedance of the VCSEL devices introduces a large impedance mismatch considering that the impedances of the transmission line and driver termination are generally either 32 or 50 ohms for current applications. Introducing a VCSEL-side equalization circuit to a VCSEL device enables matching the VCSEL side (VCSEL+equalization circuit) impedance to that of the transmission line impedance so less reflections are introduced due to mismatch and a larger amount of energy diverted to the VCSEL at high frequencies.

Figure 5:
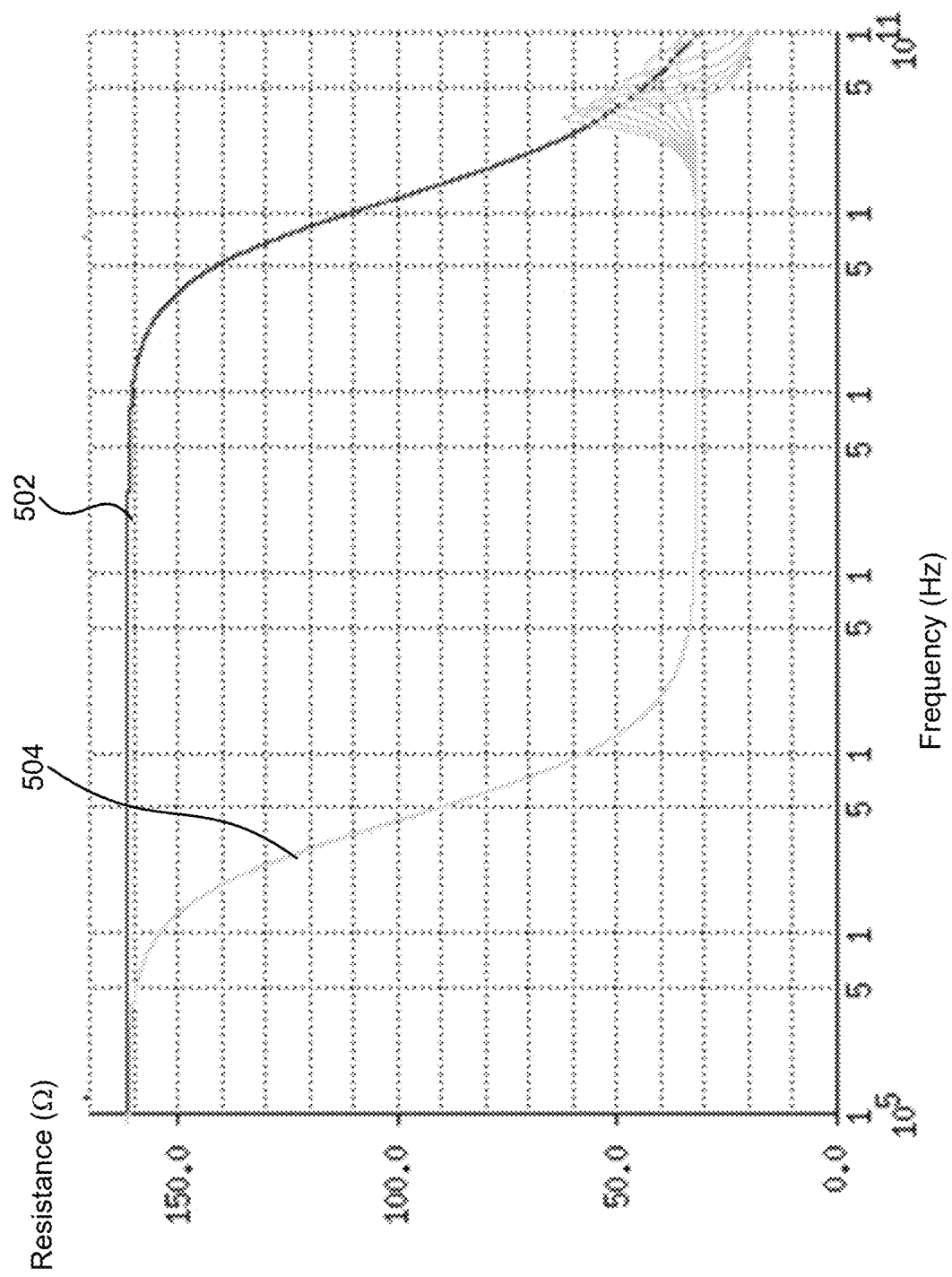
FIG. 5 is a diagram illustrating impedance vs frequency for a VCSEL with and without an equalization circuit, according to one example embodiment.

FIG. 5 is a diagram illustrating impedance vs frequency for a VCSEL with and without an equalization circuit, according to one example embodiment. The curve 502 shows the impedance data corresponding to the VCSEL without the equalization circuit, while the curves 504 show the impedance data corresponding to the VCSEL with the equalization circuit with various conditions. The equalization circuit employed here is similar to that illustrated in FIG. 3, where the inductance (Lvse) of the inductor (e.g., the inductor 306) is kept at 0.12 nH while the capacitance (Clct) of the first capacitor (e.g., the capacitor 308) is swept from 0 to 150f with a stepsize of 25f. In the curve 502, the impedance drops from 161 ohm at lower frequencies (e.g. lower than 1 GHZ) to about 50 ohm at 30 GHz. For an operation frequency range of 0.5-30 GHz for the VCSEL, the change of the impedance leads to inconsistent performance of the the VCSEL and hinders the applications that use the VCSEL. This can be remedied by the addition of the equalization circuit disclosed herein.

The curves 504 are impedance data of the VCSEL corresponding to the various capacitance conditions of the equalization circuit. As shown in FIG. 5, the equalization circuit enables the impedance to drop from 161 ohm at frequencies lower than 500 KHz to about 32 ohm at 100 MHz. The impedance is maintained at about 32 ohm from about 100 MHz to about 15 GHz. After the steady ringe, different capacitance values causes different impendence spikes. Despite the impendence spikes after about 15 GHz, with the addition of the equalization circuit, the VCSEL can operate at must smaller impendence fluctuation in the target operation frequency range (e.g., from about 0.5 GHz to about 30 GHZ), resulting in a more consistent optical output of the VCSEL at high frequencies. Optimized Lvse and Clct values for the equalization circuit can be chosen to obtain the best system performance for a particular application (e.g., cable, data center, etc.). In some embodiments, the Rvse value of the resistor (e.g., the resistor 310 in FIG. 3) of the equalization circuit can be chosen to match the impedance at a middle frequency (e.g., 1 GHZ). The techniques disclosed herein thus provide flexibility to design a suitable equalization circuit for a particular VCSEL and improve the performance of the VCSEL at mid to high frequencies e.g., from about 0.5 GHz to about 30 GHz, from about 0.5 GHz to about 40 GHz, from about 0.5 GHz to about 50 GHz, from about 0.5 GHz to about 75 GHz, from about 0.5 GHz to about 100 GHz, from about 0.5 GHz to about 200 GHz, from about 0.5 GHz to about 300 GHz, from about 0.5 GHz to about 500 GHz, from about 0.5 GHz to about 750 GHz, from about 0.5 GHz to about 1 THz, or from about 0.5 GHz to more than 1 THz.

The techniques disclosed herein can extend the optical bandwidth of a VCSEL to high operation frequencies. For example, a 3.2 Tbps optical SerDes instance can be achieved by increasing both the bandwidth of the VCSEL and the number of lanes employed in the solution. A previous design has 24 lanes, each running at 53 Gbps PAM4 for an aggregate bandwidth of 1.2 Tbps (per direction). A current solution employs 32 lanes running at a 106 Gbps PAM4 rate. The increased speed and lane counts each present new challenges. To increase speed, the VCSEL design is being moved from a 16 nm CMOS integrated circuit technology to a 7 nm CMOS technology. While this provides some inherent speed improvement, it is nowhere near the doubling the a bandwidth as required by the next generation solution. The disclosed equalization circuit can extend the operation frequency of the VCSEL by two or more folds, and is desirable for the next generation solution.

Inclusion of the disclosed equalization circuit brings an adaptive design to an optical system. VCSELs vary in impedance, bandwidth, and other parameters. Because the equalization circuit can be disposed on an interposer, it allows flexibility in a quick design change when there is need to switch to a different VCSEL in the system compared to regular chips. For example, when a VCSEL impedance is increased, a resistance (Rvse) of a resistor (e.g., the resistor 310) for the equalization circuit can be reduced to produce an impedance value that matches with the transmission line and/or driver's impedance. This flexibility reduces the time from design to product and cost to develop a new system.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

In common usage, the term "or" should always be construed in the inclusive sense unless the exclusive sense is specifically indicated or logically necessary. The exclusive sense of "or" is specifically indicated when, for example, the term "or" is paired with the term "either," as in "either A or B." As another example, the exclusive sense may also be specifically indicated by appending "exclusive" or "but not both" after the list of items, as in "A or B, exclusively" and "A and B, but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. An optical emitter, comprising:
a vertical cavity surface emitting laser (VCSEL);
an equalization circuit coupled to the VCSEL; and
a current source coupled to the VCSEL and the equalization circuit, wherein the equalization circuit is configured to divert a first current from the current source to the VCSEL at a first data frequency and divert a second current greater than the first current from the current source to the VCSEL at a second data frequency higher than the first data frequency;
wherein the equalization circuit comprises an inductor, a first capacitor, a resistor, and a second capacitor, wherein:
the inductor is coupled between a first terminal of the VCSEL and a first terminal of the resistor;
the first capacitor is coupled in parallel with the inductor and between the first terminal of the VCSEL and the first terminal of the resistor; and
the resistor has a second terminal coupled in series with a first terminal of the second capacitor.

2. The optical emitter of claim 1, wherein the first terminal of the VCSEL is further coupled to a transmission line.

3. The optical emitter of claim 2, wherein:
the VCSEL has a VCSEL resistance;
the transmission line has a transmission line resistance,
wherein the resistor is selected such that a resulting resistance of the VCSEL and the resistor is about the transmission line resistance.

4. The optical emitter of claim 3, wherein:
the VCSEL resistance is greater than a resistance of the resistor.

5. The optical emitter of claim 4, wherein:
the resulting resistance is less than the VCSEL resistance or the resistance of the resistor.

6. The optical emitter of claim 1, wherein the VCSEL has a second terminal opposite to the first terminal of the VCSEL, wherein the second terminal of the VCSEL is coupled to the current source.

7. The optical emitter of claim 1, wherein the second capacitor has a second terminal opposite to the first terminal of the second capacitor, wherein the second terminal of the second capacitor is coupled to a reference voltage.

8. The optical emitter of claim 1, wherein:
the equalization circuit is disposed on an interposer coupled to the VCSEL, wherein the interposer is separable from the VCSEL.

* * * * *